US008716734B2

(12) United States Patent
Tsai et al.

(10) Patent No.: US 8,716,734 B2
(45) Date of Patent: May 6, 2014

(54) LIGHT EMITTING DIODE PACKAGE HAVING A PORTION OF REFLECTION CUP MATERIAL COVERING ELECTRODE LAYER ON SIDE SURFACES OF SUBSTRATE

(75) Inventors: Ming-Ta Tsai, Hsinchu (TW); Ching-Chung Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 168 days.

(21) Appl. No.: 13/336,010

(22) Filed: Dec. 23, 2011

(65) Prior Publication Data

US 2012/0256219 A1   Oct. 11, 2012

(30) Foreign Application Priority Data

Apr. 11, 2011   (CN) .......................... 2011 1 0089603

(51) Int. Cl.
*H01L 33/38*   (2010.01)
*H01L 33/48*   (2010.01)

(52) U.S. Cl.
CPC ............ *H01L 33/385* (2013.01); *H01L 33/486* (2013.01)
USPC .. 257/98; 257/99; 257/E33.057; 257/E33.065

(58) Field of Classification Search
CPC ........................... H01L 33/385; H01L 33/486
USPC ..................... 257/98, 99, E33.057, E33.065; 313/486, 512
See application file for complete search history.

(56) References Cited

U.S. PATENT DOCUMENTS

| 5,177,593 | A | * | 1/1993 | Abe | 257/98 |
| 7,728,507 | B2 | * | 6/2010 | Winter et al. | 313/498 |
| 8,044,418 | B2 | | 10/2011 | Loh et al. | |
| 2003/0030060 | A1 | * | 2/2003 | Okazaki | 257/79 |
| 2004/0041521 | A1 | * | 3/2004 | Mandler et al. | 313/512 |
| 2005/0212397 | A1 | * | 9/2005 | Murazaki et al. | 313/487 |
| 2009/0008673 | A1 | * | 1/2009 | Kato et al. | 257/100 |

FOREIGN PATENT DOCUMENTS

| CN | 101246938 A | 8/2008 |
| TW | 200616246 A | 5/2006 |

* cited by examiner

*Primary Examiner* — Anh Mai
(74) *Attorney, Agent, or Firm* — Novak Druce Connolly Bove + Quigg LLP

(57) ABSTRACT

An LED package includes a substrate, an electrode layer, a light-emitting chip, a reflection cup and an encapsulation. The substrate includes a first surface, an opposite second surface, and two side surfaces. The electrode layer is consisted of a positive electrode and a negative electrode, each of which extends from the first surface to the second surface via a respective side surface. The light-emitting chip is located on the first surface of the substrate and electrically connected to the electrode layer. The reflection cup comprises a first part covering the electrode layer on the side surfaces of the substrate, a second part with a bowl-like shape on the first surface of the substrate and surrounding the light-emitting chip. The encapsulation is filled in the second part of the reflection cup.

7 Claims, 8 Drawing Sheets

LIGHT EMITTING DIODE PACKAGE HAVING A PORTION OF REFLECTION CUP MATERIAL COVERING ELECTRODE LAYER ON SIDE SURFACES OF SUBSTRATE

BACKGROUND

1. Technical Field

The present disclosure generally relates to light emitting diode (LED) packages and method of manufacturing the same.

2. Description of Related Art

In recent years, light emitting diodes (LEDs) have become more and more popular, due to their low power-consumption, energy saving properties, high efficiency, short reactive time and long life. A typical LED package includes a sapphire substrate on which a reflection cup is formed, and a light-emitting chip placed in the reflection cup and attached on the sapphire substrate. However, a gap exists between the substrate and the reflection cup, such that vapor and dust tend to intrude the LED package, the light-emitting chip would be influenced thereby, and the luminous efficiency of the LED package may be depressed.

Therefore, it is necessary to provide an LED package and a method of manufacturing the same which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED package and method for manufacturing the same in detail.

Figure 1:
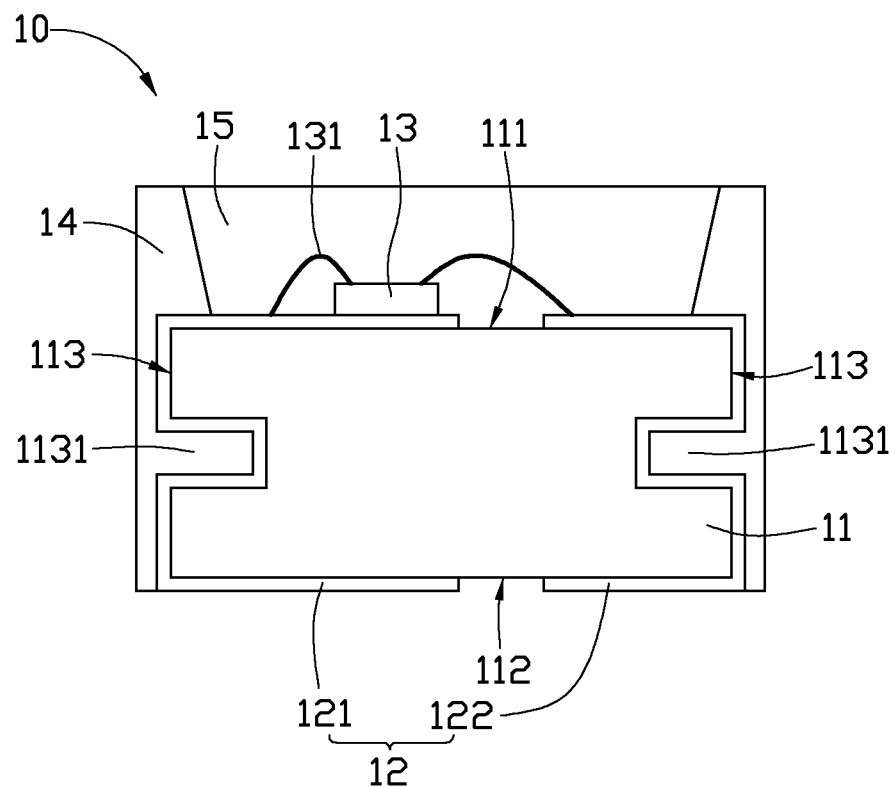
FIG. 1 is a schematic, cross-sectional view of an LED package in accordance with an embodiment of the present disclosure.

Referring to FIG. 1, an LED package 10 according to an exemplary embodiment includes a substrate 11, an electrode layer 12, a light-emitting chip 13, a reflection cup 14, and an encapsulation 15.

The substrate 11 includes a first surface 111 (i.e., top surface), an opposite second surface 112 (i.e., bottom surface), and two side surfaces 113 connected between left and right edges of the first surface 111 and the second surface 112, respectively. The side surfaces 113 each have a recess 1131 defined therein. An extending (recessed) direction of the recess 1131 is parallel to the first surface 111. The recesses 1131 can be shaped with any configuration according to a computer simulation in advance. Alternatively, the recesses 1131 respectively defined on the two side surfaces 113 can be further recessed to communicate with each other.

The electrode layer 12 is consisted of a positive electrode 121 and a negative electrode 122 electrically insulated from the positive electrode 121. The electrode layer 12 is formed on the substrate 11; that is, the positive electrode 121 extends from the first surface 111 to the second surface 112 via the left side surface 113 of the substrate 11, and the negative electrode 122 extends from the first surface 111 to the second surface 112 via the right side surface 113 of the substrate 11. Moreover, the positive electrode 121 and the negative electrode 122 are both attached to the side surfaces 113 of the substrate 11, and respectively extend into the corresponding recesses 1131 to cover the whole inner sides of the recesses 1131. The electrode layer 12 is made of metal with high electrical conductivity, such as gold (Au), silver (Ag), copper (Cu), or an alloy thereof.

The light-emitting chip 13 is located on the first surface 111 of the substrate 11. In the present embodiment, the light-emitting chip 13 is mounted on the exposed part of the positive electrode 121 and electrically connected to the positive electrode 121 and the negative electrode 122 by metal wires 131. It can be understood that, the light-emitting chip 13 can be a flip-chip LED chip in an alternative embodiment.

The reflection cup 14 surrounds the substrate 11. A part of the reflection cup 14 covers the electrode layer 12 on the side surfaces 113 of the substrate 11 and extends into the recesses 1131, while the other part of the reflection cup 14, which has a bowl-shaped configuration, extends over a periphery of the first surface 111 of the substrate 11 to surround the light-emitting chip 13. In the present embodiment, the part of the reflection cup 14 covering the electrode layer 12 completely fills the recesses 1131. In addition, the material of the reflection cup 14 is different from that of the substrate 11.

Figure 2:
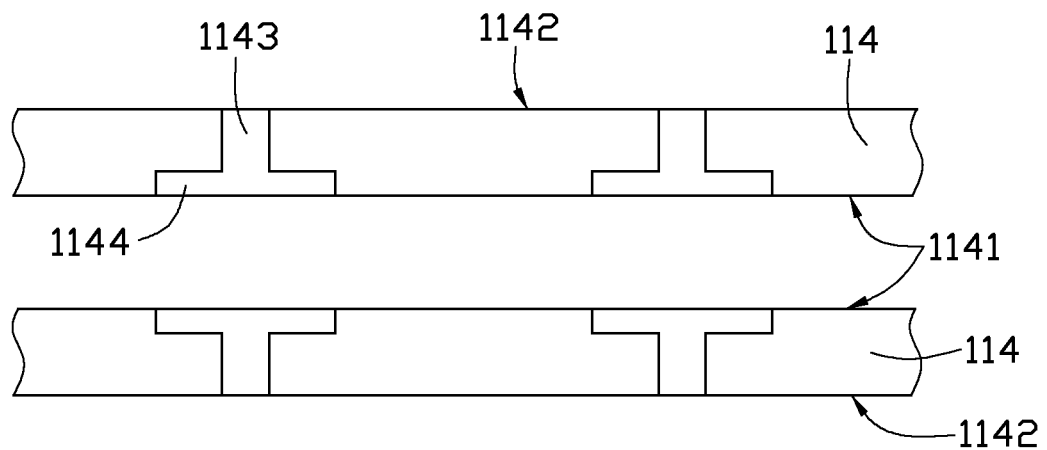
FIGS. 2-8 are schematic, cross-sectional views illustrating steps of a method for manufacturing the LED package in FIG. 1.

The encapsulation 15 is filled in a cavity defined at a center of the bowl-shaped part of the reflection cup 14 to cover the light-emitting chip 13 and the metal wires 131. The encapsulation 15 is made of the silicone, epoxy resin or a mixture thereof. The encapsulation 15 may further include various phosphors doped therein, such as TAG (terbium aluminum garnet) or YAG (yttrium aluminum garnet), whereby light from LED package 10 can have a desired color. The encapsulation 15 can further protect the light-emitting chip 13 from contaminants Referring to FIGS. 2-8, the present disclosure provides a method for manufacturing the LED package 10 which comprises the following steps:

As shown in FIG. 2, a pair of bases 114 is provided. Each base 114 has a coupling surface 1141 and an opposite outmost surface 1142. The two bases 114 are placed opposite to each other, and the coupling surfaces 1141 of the two bases 114 are so positioned that they are neighboring to each other. A number of through holes 1143 are defined in each base 114 and extend from the coupling surfaces 1141 to the outmost surface 1142. Although only two through holes 1143 are shown in FIG. 2, it can be understood that the number of the through holes 1143 is more than two, depending on the actual size of the base 114. Preferably, the through holes 1143 defined in each base 114 are parallel to each other. In this embodiment, each through hole 1143 includes a narrow portion adjacent to the outmost surface 1142 and a wide portion adjacent to the coupling surface 1141. The wide portion is larger than the narrow portion in diameter, and a depth of the wide portion is much less than that of the narrow portion. A stepped structure 1144 is thus formed at a joint of the narrow portion and the wide portion adjacent to the coupling surface 1141. In the present embodiment, the two bases 114 are silicon wafers, and the through holes 1143 and the corresponding stepped structures 1144 are formed by etching process.

Figure 3:
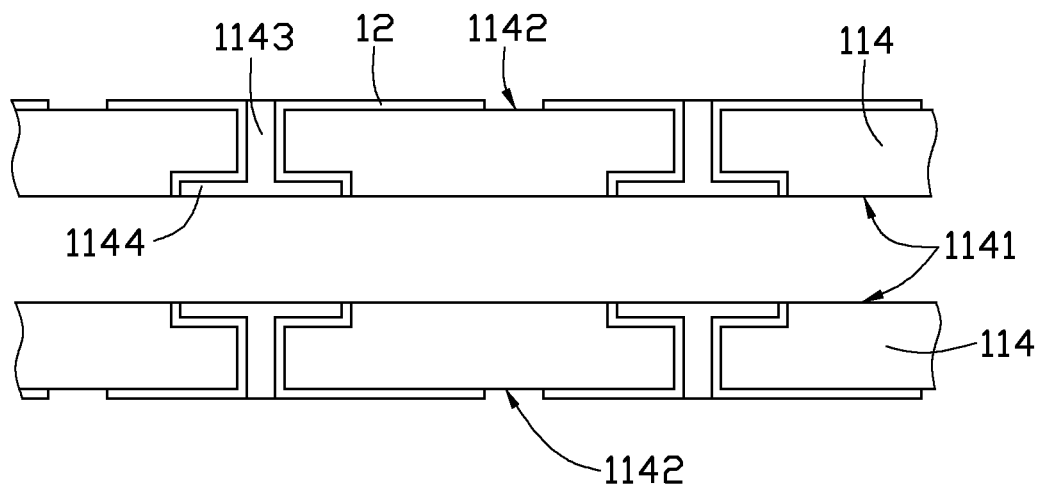

As show in FIG. 3, an electrode layer 12 is formed on each base 114 to cover the outmost surface 1142 and an inner wall (not labeled) surrounding each through hole 1143. The part of the electrode layer 12 that is formed on the outmost surface 1142 is consisted of two separated parts between two neighboring through hole 1143, wherein one part serves as a positive electrode and the other part acts as a negative electrode. The electrode layer 12 is made of metal with high electrical conductivity, such as gold (Au), silver (Ag), copper (Cu), or an alloy thereof, and is formed on each base 114 by electroplating, magnetron sputtering, wafer level bonding, etc.

Figure 4:
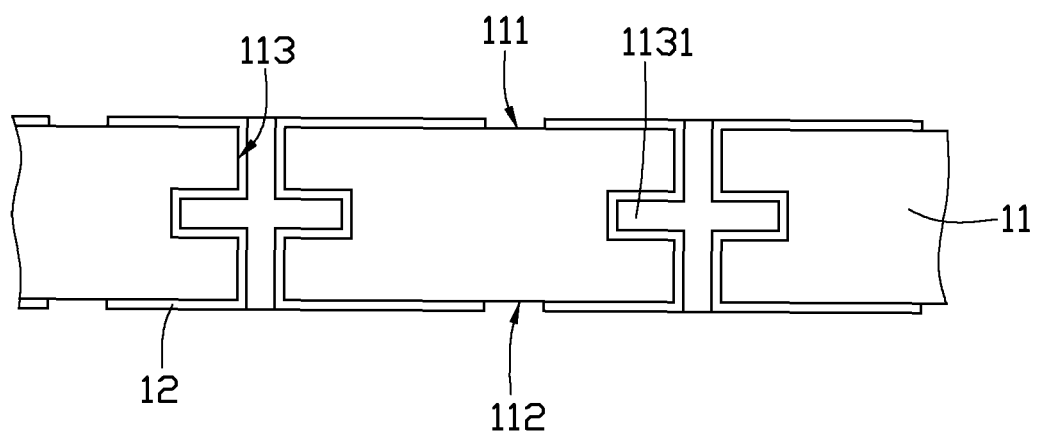

Referring to FIGS. 3 and 4, the coupling surfaces 1141 of the pair of bases 114 are joined together, such that the electrode layer 12 formed on the inner walls surrounding the through holes 1143 of one base 114 is connected to that of the other base 114 to form a semi-finished product as shown in FIG. 4, which has a plurality of repeated portions (only one shown in FIG. 4) each having a structure similar to that of the substrate 11 shown in FIG. 1. When the two bases 114 are joined together to form the substrate 11, the wide portions of the through holes 1143 are combined together to form large holes which will be used form the recesses 1131 shown in FIG. 1 in a later processing step. The outmost surfaces 1142 of the two bases 114 respectively serve as the first surface 111 and the second surface 112 of the substrate 11 shown in FIG. 1. It can be understood, in an alternative embodiment, that the electrode layer 12 can be formed on the outmost surfaces 1142 and the inner wall (not labeled) surrounding each through hole 1143 after the two separated bases 114 have been joined together. In the present embodiment, the two separated bases 114 are combined together to form the substrate 11 by wafer level bonding.

Figure 5:
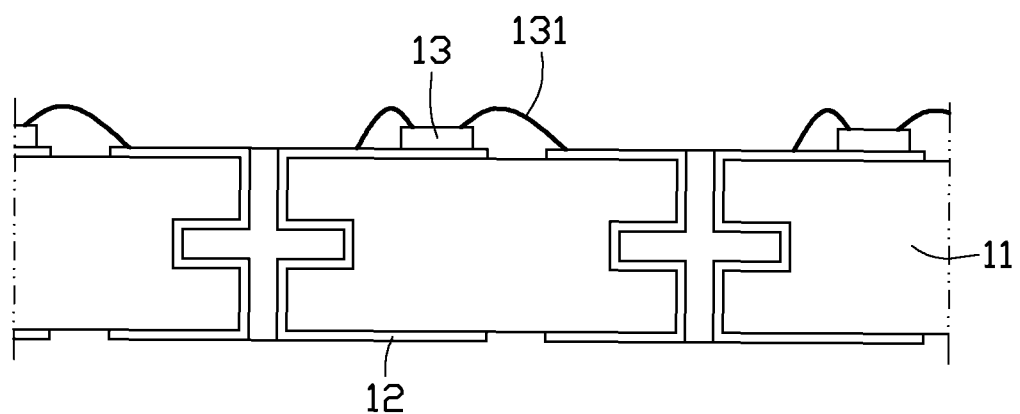

As shown in FIG. 5, a light-emitting chip 13 is mounted on a respectively separated part of the electrode layer 12 on the substrate 11. In the present embodiment, the light-emitting chip 13 is affixed to the respectively separated part of the electrode layer 12 by using glue. The light-emitting chip 13 is electrically connected to the two separated parts of the electrode layer 12 between two neighboring through holes 1143 by metal wires 131.

Figure 6:
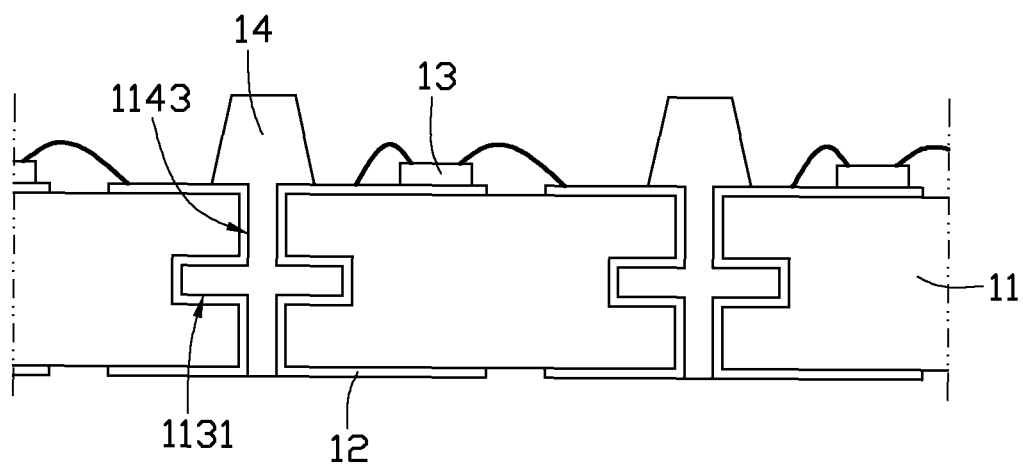

As shown in FIG. 6, a reflection cup 14 is formed on the first surface 111 of the substrate 11 to cover each of the two neighboring through holes 1143, wherein the reflection cup 14 surrounds the light emitting chip 13. A part of the reflection cup 14 fills into the two neighboring through holes 1143. In the present embodiment, the reflection cup 14 is formed by injection molding or transfer molding.

Figure 7:
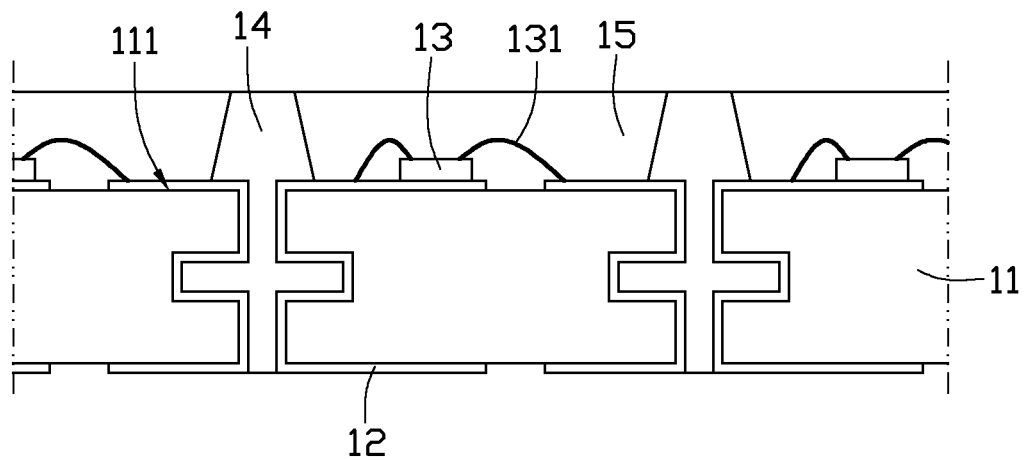

As shown in FIG. 7, an encapsulation 15 is formed on the first surface 111 of the substrate 11 and fills in the reflection cup 14 to cover the light-emitting chip 13 and the metal wires 131. The encapsulation 15 is made of the silicone, epoxy resin or a mixture thereof. In addition, some phosphors (not shown) may be doped in the encapsulation 15, such as TAG or YAG.

Figure 8:
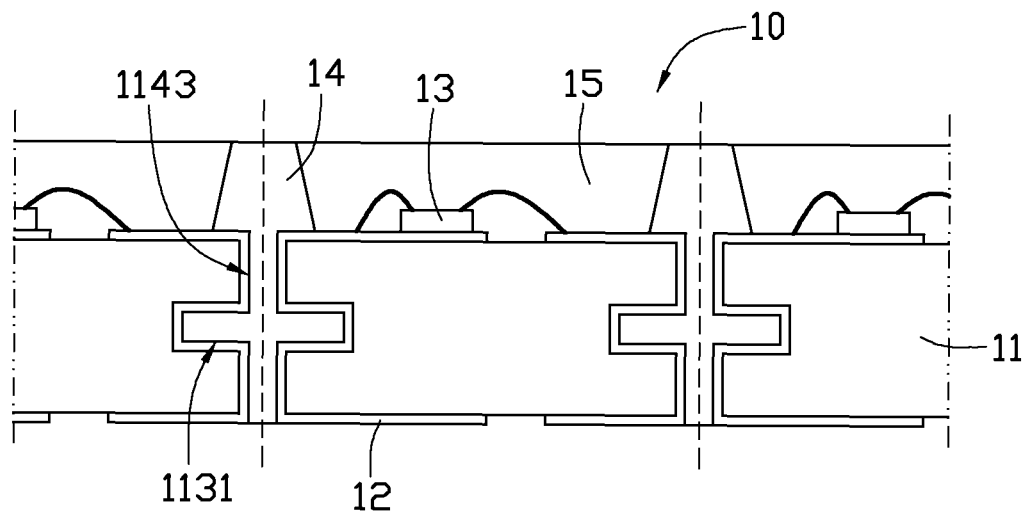

As shown in FIG. 8, the thus obtained semi-finished product after the steps of FIG. 2-7 is further cut to make a plurality of separated LED packages 10 each having a structure similar to the LED package 10 shown in FIG. 1 along a center line of each through hole 1143 (as indicated by broken lines shown in the drawing).

It can be understood that, in an alternative embodiment, the substrate 11 can be formed from a single piece of silicon wafer. Then the through holes 1143 with enlarged middle portions are formed in the single-pieced substrate wafer directly. Thereafter, the electrode layer 12 is formed on the outmost surface 1142 and an inner wall (not labeled) of the single-pieced wafer surrounding each through hole 1143. The part of electrode layer 12 formed on the outmost surface 1142 is consisted of two separated parts between two neighboring through holes 1143, one part serving as a positive electrode and the other part acting as a negative electrode. The following steps are the same as those shown in FIGS. 5-8.

As described above, a part of the reflection cup 14 covers the electrode layer 12 on the side surfaces 113 of the substrate 11, such that the connecting area between the reflection cup 14 and the substrate 11 is increased. This means that the path of external vapor or dust running into the LED package 10 along an interface between the reflection cup 14 and the substrate 11 becomes longer; therefore, the external vapor and dust can be blocked off effectively from the light emitting chip 13. Moreover, since the recesses 1131 are formed in the side surfaces 113, and the reflection cup 14 has a part filling the recesses 1131 completely, the path of external vapor or dust intruding in the LED package 10 is further extended, whereby the external vapor and dust can be blocked off from the light emitting chip 13 more effectively. In addition, due to the electrode layer 12 which mounted on the side surfaces 113 of the substrate 11 is covered by the reflection cup 14, the electrode layer 12 is protected from oxidation.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package comprising:
    a substrate comprising a first surface, an opposite second surface, and two side surfaces connected between the first surface and the second surface, the side surfaces each have a recess defined therein, an extending direction of each recess being parallel to the first surface;
    an electrode layer consisted of a positive electrode and a negative electrode separated from the positive electrode, the positive electrode being formed on the substrate and extending from the first surface to the second surface via one side surface of the substrate, and the negative electrode being formed on the substrate and extending from the first surface to the second surface via the other side surface of the substrate, and the positive electrode and the negative electrode respectively extending into the recesses;
    a light-emitting chip located on the first surface of the substrate and electrically connected to the positive electrode and the negative electrode;
    a reflection cup surrounding the substrate and covering the electrode layer, the reflection cup comprising a first part covering the electrode layer on the side surfaces of the substrate and filling the recesses, and a second part on the first surface of the substrate, the second part being bowl-shaped and surrounding the light-emitting chip; and
    an encapsulation filled in the second part of the reflection cup to cover the light-emitting chip.

2. The LED package according to claim 1, wherein the light-emitting chip is electrically connected to the electrical layer by wire-bonding.

3. The LED package according to claim 1, wherein the material of the reflection cup is different from that of the substrate.

4. An LED package comprising:
    a substrate comprising a first surface, an opposite second surface, and two side surfaces between the first surface and the second surface, the side surfaces each having a recess defined therein, an extending direction of each recess being parallel to the first surface;
    an electrode layer consisted of two separated parts, one of the separated parts of the electrode layer attached on one side surface of the substrate, said one of the separated parts of the electrode layer extending onto the first surface and the second surface of the substrate, respectively, the other of the separated parts of the electrode layer attached on the other side surface of the substrate, said other of the separated parts of the electrode layer extending onto the first surface and the second surface of the substrate, respectively, the two separated parts of the electrode layer extending into the recesses, respectively;

a light-emitting chip located on the first surface of the substrate and electrically connected to the two separated parts of the electrode layer;

a reflection cup placed on a periphery of the substrate and covering the electrode layer, an upper part of the reflection cup located on and attached to the first surface of the substrate to surround the light-emitting chip, and a bottom part of the reflection cup attached to the electrode layer on the side surfaces of the substrate and filling the recesses; and an encapsulation filled in the upper part of the reflection cup to cover the light-emitting chip.

5. The LED package according to claim 4, wherein the upper part of the reflection cup is bowl-shaped.

6. The LED package according to claim 4, wherein the light-emitting chip is electrically connected to the two separated parts of the electrode layer by wire-bonding.

7. The LED package according to claim 4, wherein the material of the reflection cup is different from that of the substrate.

* * * * *